(12) United States Patent
Kuo et al.

(10) Patent No.: US 8,587,017 B2
(45) Date of Patent: Nov. 19, 2013

(54) LIGHT EMITTING DEVICE AND METHOD OF FABRICATING A LIGHT EMITTING DEVICE

(75) Inventors: Wei-Hung Kuo, Hsinchu (TW); Yi-Keng Fu, Hsinchu (TW); Suh-Fang Lin, Hsinchu (TW); Rong Xuan, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 126 days.

(21) Appl. No.: 13/070,486

(22) Filed: Mar. 24, 2011

(65) Prior Publication Data
US 2011/0254044 A1 Oct. 20, 2011

Related U.S. Application Data

(63) Continuation-in-part of application No. 12/648,308, filed on Dec. 29, 2009, now Pat. No. 8,173,456.

(60) Provisional application No. 61/223,060, filed on Jul. 5, 2009.

(51) Int. Cl.
*H01L 33/00* (2010.01)
*H01L 21/00* (2006.01)

(52) U.S. Cl.
USPC .................................. 257/99; 257/E33.062

(58) Field of Classification Search
USPC ................................ 257/99, E33.062; 438/27
See application file for complete search history.

(56) References Cited

U.S. PATENT DOCUMENTS

| 5,633,913 | A | 5/1997 | Talarmo |
| 5,794,151 | A | 8/1998 | McDonald et al. |
| 5,874,747 | A * | 2/1999 | Redwing et al. ............... 257/77 |
| 6,714,789 | B1 | 3/2004 | Oh et al. |
| 7,359,715 | B2 | 4/2008 | Choksi |
| 7,363,043 | B2 | 4/2008 | Jaeckle et al. |

(Continued)

FOREIGN PATENT DOCUMENTS

TW 200812105 3/2008

OTHER PUBLICATIONS

T. Fujii et al, "Increase in the extraction efficiency of GaN-based light-emitting diodes via surface roughening", Applied Physics Letters, vol. 84, No. 6, issued on Feb. 9, 2004, p. 855-p. 857.

(Continued)

*Primary Examiner* — Fernando L Toledo
*Assistant Examiner* — Neil Prasad
(74) *Attorney, Agent, or Firm* — Jianq Chyun IP Office

(57) ABSTRACT

A light emitting device and a method of fabricating a light emitting device are provided. The light emitting device includes a carrier substrate, at least one epitaxy structure, a high resistant ring wall, a first electrode, and a second electrode. The epitaxy structure is disposed on the carrier substrate and includes a first semiconductor layer, an active layer, and a second semiconductor layer stacked in sequence. The first semiconductor layer is relatively away from the carrier substrate and the second semiconductor layer is relatively close to the carrier substrate. The high resistant ring wall surrounds the epitaxy structure and a width of the high resistant ring wall is greater than 5 μm. The first electrode is disposed between the carrier substrate and the epitaxy structure. The second electrode is disposed at a side of the epitaxy structure away from the carrier substrate.

9 Claims, 12 Drawing Sheets

(56) References Cited

U.S. PATENT DOCUMENTS

| | | |
|---|---|---|
| 7,554,942 B2 | 6/2009 | Joong et al. |
| 7,606,938 B2 | 10/2009 | Roese et al. |
| 7,687,810 B2 | 3/2010 | Mo et al. |
| 7,693,527 B2 | 4/2010 | Krstulich |
| 7,781,242 B1 | 8/2010 | Chen et al. |
| 7,838,315 B2 | 11/2010 | Yang et al. |
| 7,958,041 B2 | 6/2011 | Stanforth et al. |
| 8,139,496 B2 | 3/2012 | Stanforth et al. |
| 8,234,208 B2 | 7/2012 | Stanforth et al. |
| 2005/0079642 A1 | 4/2005 | Tamura |
| 2005/0260973 A1 | 11/2005 | van de Groenendaal |
| 2006/0154389 A1 | 7/2006 | Doan |
| 2007/0077673 A1 | 4/2007 | Hwang et al. |
| 2007/0164298 A1 | 7/2007 | Kim et al. |
| 2007/0295952 A1 | 12/2007 | Jang et al. |
| 2008/0210969 A1* | 9/2008 | Yuan et al. ............ 257/98 |
| 2009/0137075 A1 | 5/2009 | Yang et al. |
| 2010/0087166 A1 | 4/2010 | Agashe |
| 2012/0161113 A1* | 6/2012 | Lowenthal et al. ........ 257/40 |

OTHER PUBLICATIONS

Shui-Jinn Wang et al, "Use of patterned laser liftoff process and electroplating nickel layer for the fabrication of vertical-structured GaN-based light-emitting diodes", Applied Physics Letters 87, 2005 American Institute of Physics, 2005, issued on Jul. 1, 2005, p. 011111-1-p. 011111-3.

W.Y.Lin et al, "High-Power GaN-Mirror-Cu Light-Emitting Diodes for Vertical Current Injection Using Laser Liftoff and Electroplating Techniques", IEEE Photonics Technology Letters, vol. 17, No. 9, issued on Sep. 2005, p. 1809-p. 1811.

D.W.Kim et al, "Highly efficient vertical laser-liftoff GaN-based light-emitting diodes formed by optimization of the cathode structure", Applied Physics Letters 86, 2005 American Institute of Physics, issued on Jan. 28, 2005, p. 052108-1-p. 052108-3.

Dong-Sing Wuu et al, "Ga/Mirror/Si Light-Emitting Diodes for Vertical Current Injection by Laser Lift-Off and Wafer Bonding Techniques", Japanese Journal of Applied Physics, vol. 43, No. 8A, 2004 The Japan Society of Applied Physics, issued on Aug. 10, 2004, p. 5239-p. 5242.

* cited by examiner

LIGHT EMITTING DEVICE AND METHOD OF FABRICATING A LIGHT EMITTING DEVICE

CROSS-REFERENCE TO RELATED APPLICATION

This is a continuation-in-part application of and claims the priority benefit of U.S. patent application Ser. No. 12/648,308, filed on Dec. 29, 2009, now U.S. Pat. No. 8,173,456 which claims the priority benefit of U.S. provisional application Ser. No. 61/223,060, filed on Jul. 5, 2009. The entirety of each of the above-mentioned patent applications is hereby incorporated by reference herein and made a part of this specification.

BACKGROUND OF THE DISCLOSURE

1. Field of the Disclosure

The disclosure relates to a light emitting device and a method of fabricating the light emitting device.

2. Description of Related Art

Light emitting diodes (LEDs) may have horizontal structures and vertical structures, etc. in application. Since electrodes of the conventional horizontal LED are disposed at the same side thereof, a mesa portion may have a current crowding phenomenon, which may cause a poor heat dissipation effect and limit a magnitude of a driving current that can be afforded by the LED. Therefore, a present high power LED applies the vertical structure.

FIG. 1 illustrates a cross-sectional view of a conventional LED. Referring to FIG. 1, the LED 100 is a vertical LED, which includes electrodes 110 and 120, a first semiconductor layer 130, a second semiconductor layer 140, and an active layer 150. In the LED 100, along with different distances between the electrodes 110 and 120, distribution densities of a current I are also different, and at a region (for example, right below the electrode 110) with higher distribution density of the current I, the active layer 150 may have higher lighting efficiency. However, since a position of the electrode 110 is just located above the region with the highest light emitting efficiency, the electrode 110 may block the light L emitted from the active layer 150, so that a total light emitting efficiency of the LED 100 is influenced.

Moreover, when the vertical LED 100 is fabricated, an epitaxy structure Ep formed by the first semiconductor layer 130, the second semiconductor layer 140 and the active layer 150 is generally formed on a growth substrate (not shown), then the epitaxy structure Ep is transferred to a carrier substrate (not shown), and the growth substrate (not shown) is subsequently removed. Presently, a method of separating the growth substrate is mainly a laser lift-off (LLO) method, by which a KrF laser located at a side of the growth substrate is used to irradiate an interface between the growth substrate and the semiconductor layer (for example, a gallium nitride layer), and after the device interface absorbs enough energy, the growth substrate is separated therefrom. However, when the LLO method is used, control of the laser energy is not easy, and fissures are liable to be generated around the device within a width range of about 10 μm, and after a long time operation of the device, a problem of current leakage is occurred. Therefore, the LED 100 usually has a current leakage phenomenon, especially at a sidewall part thereof.

SUMMARY OF THE DISCLOSURE

An embodiment of the disclosure provides a light emitting device including a carrier substrate, at least one epitaxy structure, a high resistant ring wall, a first electrode, and a second electrode. The epitaxy structure is disposed on the carrier substrate and includes a first semiconductor layer, an active layer, and a second semiconductor layer stacked in sequence. The first semiconductor layer is relatively away from the carrier substrate and the second semiconductor layer is relatively close to the carrier substrate. The high resistant ring wall surrounds the epitaxy structure and a width of the high resistant ring wall is greater than 5 μm. The first electrode is disposed between the carrier substrate and the epitaxy structure. The second electrode is disposed at a side of the epitaxy structure away from the carrier substrate.

Another embodiment of the disclosure provides a method of fabricating a light emitting device, which includes following steps. A first semiconductor layer, an active layer, and a second semiconductor layer are sequentially formed on a growth substrate to form an epitaxy layer. At least one first groove is formed in the epitaxy layer, where the at least one first groove has a ring-shape pattern. At least one high resistant ring wall is formed in the at least one first groove. A part of the epitaxy layer at periphery of the at least one high resistant ring wall is removed to define at least one epitaxy structure. A first electrode is formed on the second semiconductor layer of the at least one epitaxy structure. The at least one epitaxy structure is transferred to a carrier substrate and the growth substrate is removed to expose the first semiconductor layer of the at least one epitaxy structure. A second electrode is formed on the first semiconductor layer of the at least one epitaxy structure.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 2A to FIG. 9A are top views of a process of fabricating a light emitting device according to a first embodiment of the disclosure.

FIG. 2B to FIG. 9B are cross-sectional views of FIG. 2A to FIG. 9A along a section line A-A'.

DETAILED DESCRIPTION OF DISCLOSED EMBODIMENTS

Figure 1:
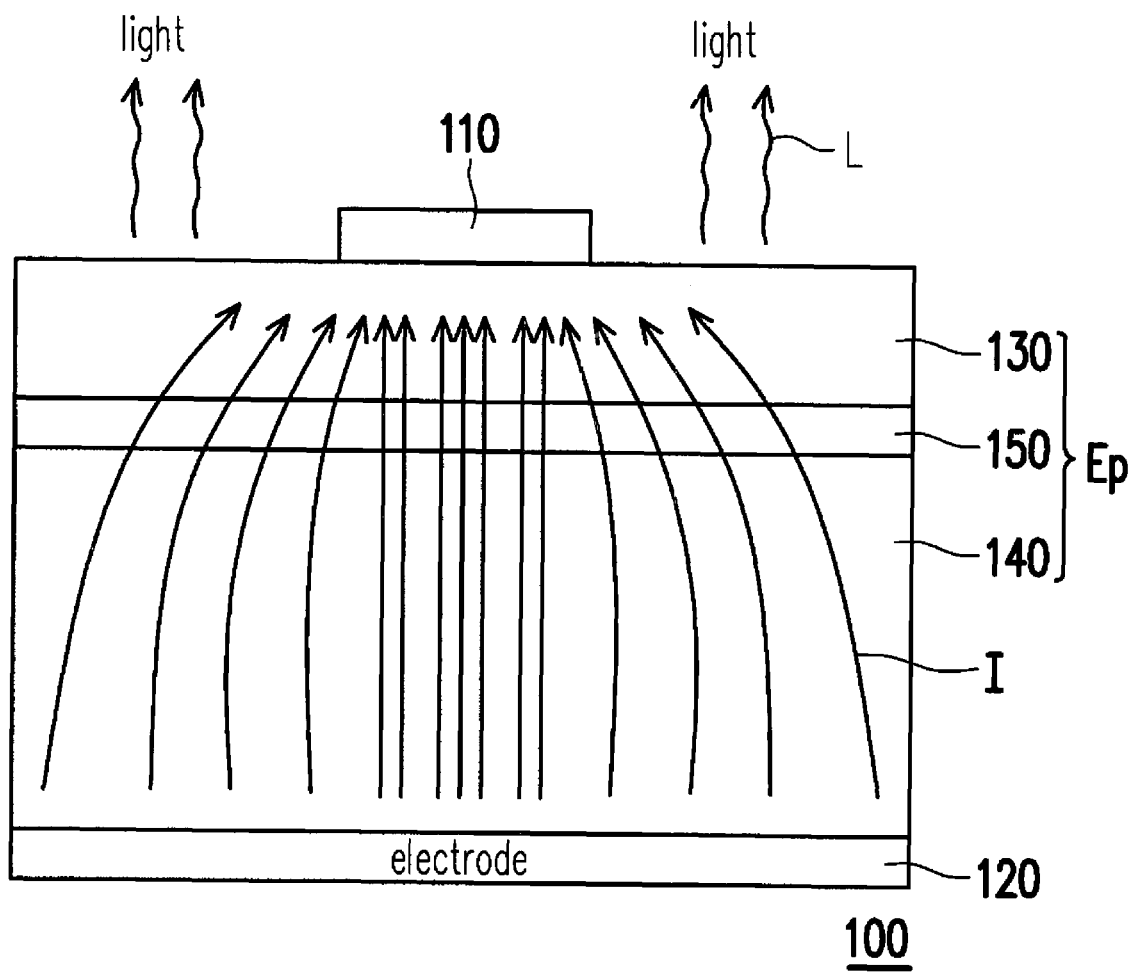
FIG. 1 illustrates a cross-sectional view of a conventional light emitting diode (LED).
Figure 2A:
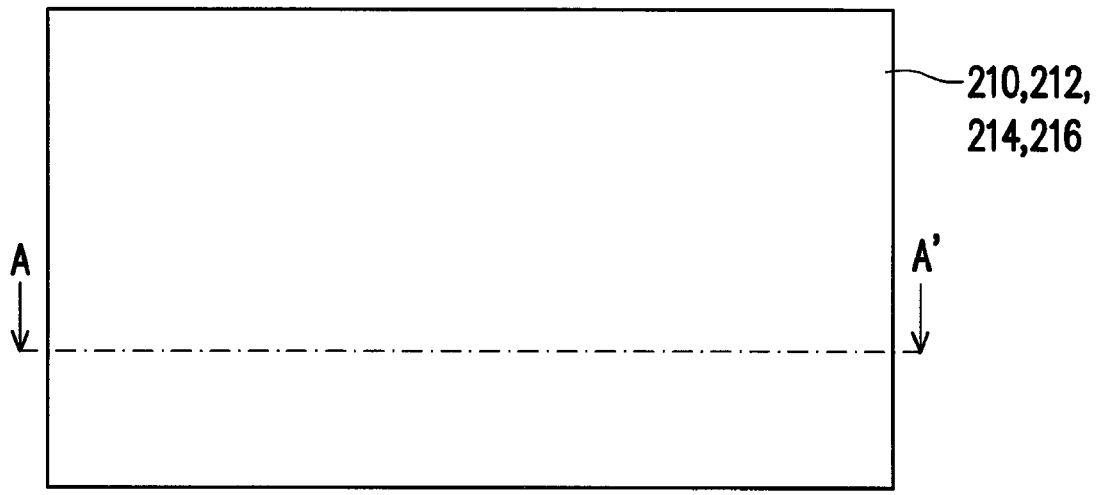
Figure 2B:
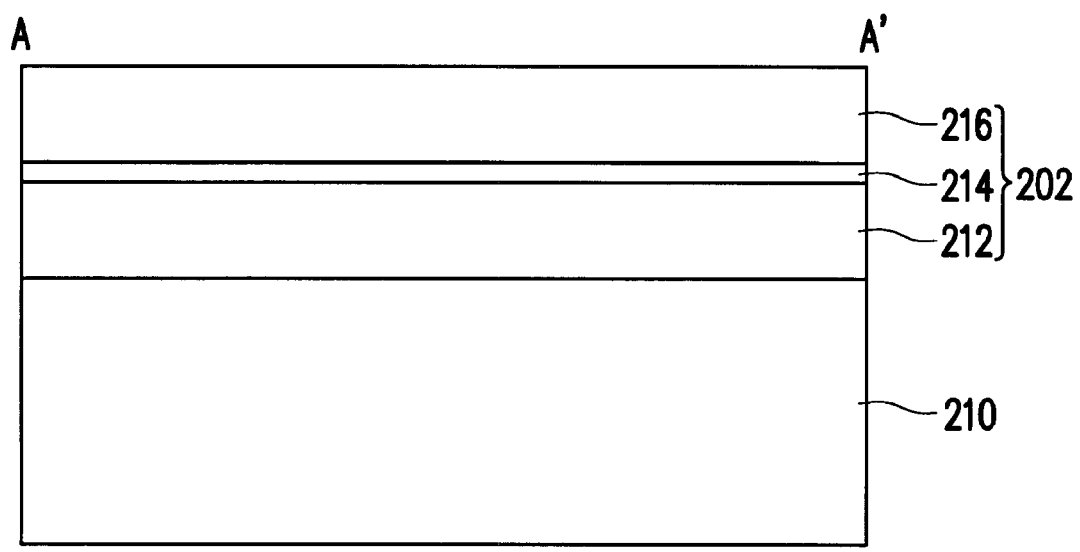

FIG. 2A to FIG. 9A are top views of a process of fabricating a light emitting device according to a first embodiment of the disclosure, and FIG. 2B to FIG. 9B are cross-sectional views of FIG. 2A to FIG. 9A along a section line A-A'. Referring to FIG. 2A and FIG. 2B, first, a first semiconductor layer 212, an active layer 214, and a second semiconductor layer 216 are sequentially formed on a growth substrate 210 to form an epitaxy layer 202. Here, in the top view of FIG. 2, the growth substrate 210, the first semiconductor layer 212, the active layer 214, and the second semiconductor layer 216 are overlapped.

In the present embodiment, the first semiconductor layer 212, the active layer 214, and the second semiconductor layer 216 can be grown on the growth substrate 210 according to an epitaxial process (for example, a metal organic chemical vapor deposition (MOCVD) method, or a molecular beam epitaxy (MBE) method). The growth substrate 210 can be a sapphire substrate, though it can also be a gallium nitride (GaN) substrate or other substrates capable of forming the first semiconductor layer 212, the active layer 214, and the second semiconductor layer 216 thereon according to the epitaxial process.

Moreover, the first semiconductor layer 212 can be an n-type GaN semiconductor layer, the second semiconductor layer 216 can be a p-type GaN semiconductor layer, and the active layer 214 can be a multiple quantum well (MQW) active layer. The MQW active layer can be an InGaN/GaN-type or an AlGaN/GaN-type MQW active layer. Moreover, in the present embodiment, the second semiconductor layer 216 can be the p-type GaN semiconductor layer, for example, a $P^+$-GaN layer, a $P^+$-InGaN layer, or a $P^+$-AlGaN layer. When a current flows between the first semiconductor layer 212 and the second semiconductor layer 216, the active layer 214 is excited to produce light, where a wavelength of the light produced by the active layer 214 can be 250 nm to 600 nm. Certainly, the above materials and values are only used as an example, which are not used to limit the disclosure.

Figure 3A:
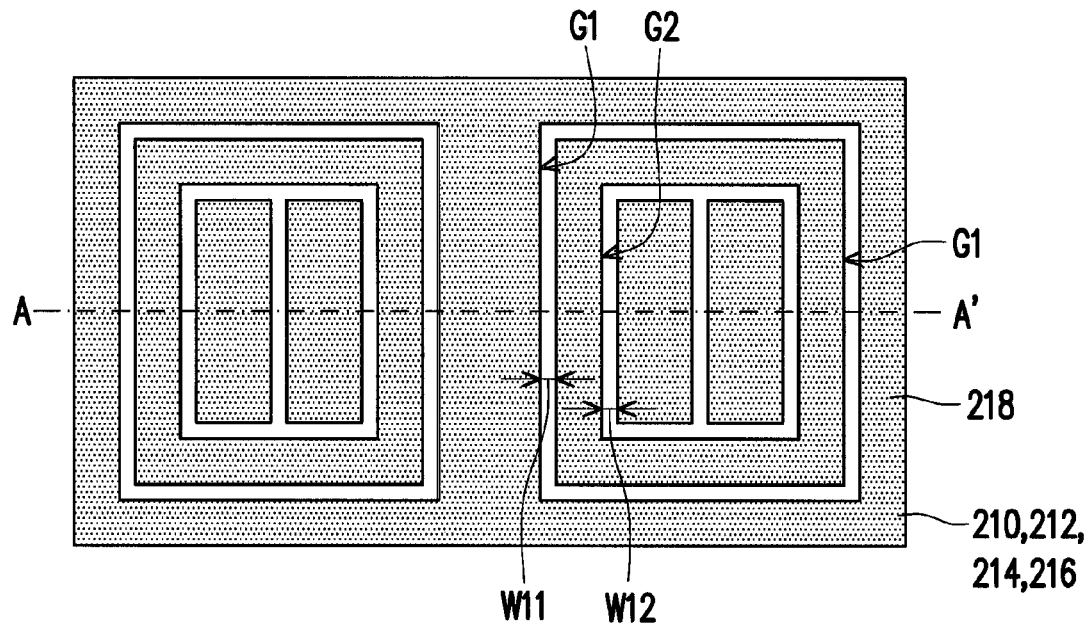
Figure 3B:
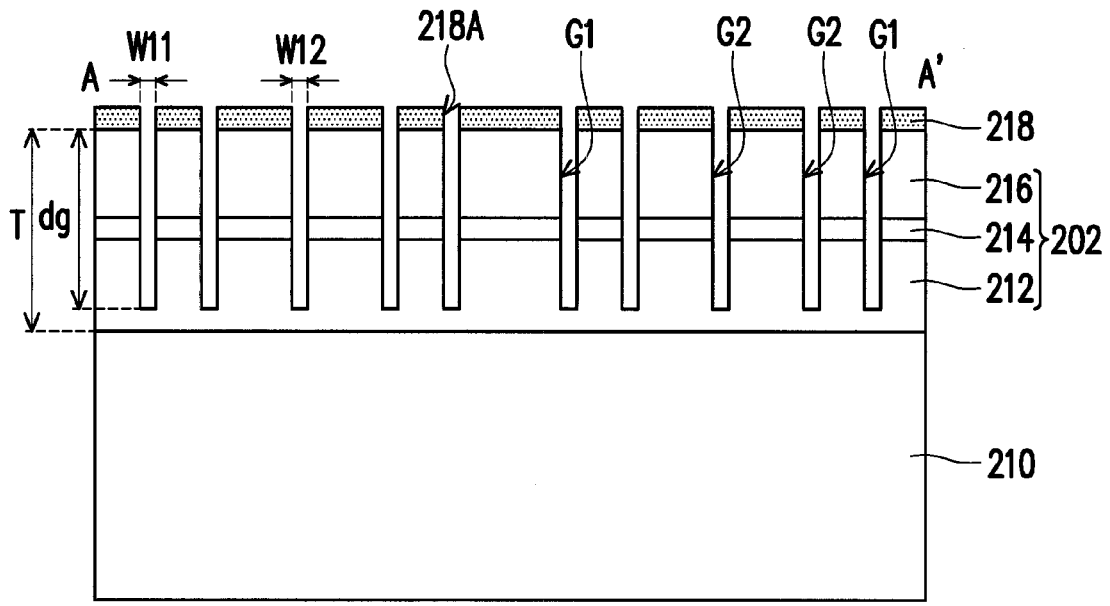

Then, referring to FIG. 3A and FIG. 3B, at least one first groove G1 and at least one second groove G2 are formed in the epitaxy layer 202. In the top view of FIG. 3A, the first groove G1 has a pattern of a closed ring, and the second groove G2 has a pattern of a "θ" shape, though the disclosure is not limited thereto. In other embodiments, the patterns of the first groove G1 and the second groove G2 can be adjusted according to demands of a designer and a final required size of the device. Moreover, in an embodiment, the designer can only form the first groove G1 in the epitaxy layer 202 without forming the second groove G2. Namely, the second groove G2 can be selectively formed or not formed in the epitaxy layer 202.

In detail, a method of forming the first groove G1 and the second groove G2 is, for example, to form a mask layer 218 on the second semiconductor layer 216 of the epitaxy layer 202 (shown in FIG. 3B), and perform an etching process while taking the mask layer 218 as a mask to obtain the first groove G1 and the second groove G2. Here, the mask layer 218 may have a plurality of openings 218A corresponding to positions of the grooves to be formed. Before the etching process is performed, the openings 218A partially expose the second semiconductor layer 216 of the epitaxy layer 202. Moreover, a material of the mask layer 218 can be silicon oxide, silicon nitride, etc., and a thickness of the mask layer 218 is about 500 nm to 2000 nm.

The etching process of forming the first groove G1 and the second groove G2 can be chlorine etching or other etching methods capable of removing the first semiconductor layer 212, the active layer 214, and the second semiconductor layer 216. Moreover, during such etching process, sizes of the first groove G1 and the second groove G2 can be determined by controlling the etching process and designing a pattern of the mask layer 218. For example, along with a size of the opening 218A of the mask layer 218, widths W11 and W12 of the first groove G1 and the second groove G2 can all be 5 μm to 50 μm. Moreover, by controlling process conditions, a depth dg of the first groove G1 and the second groove G2 can be less than a thickness T of the epitaxy layer 202, where the depth dg is, for example, 2 μm to 5 μm. In the present embodiment, the first groove G1 and the second groove G2 may expose a part of the first semiconductor layer 212. Certainly, the above sizes are not used to limit the disclosure, and in other embodiments, the size of the grooves can be adjusted according to different design requirements and device sizes.

Figure 4A:
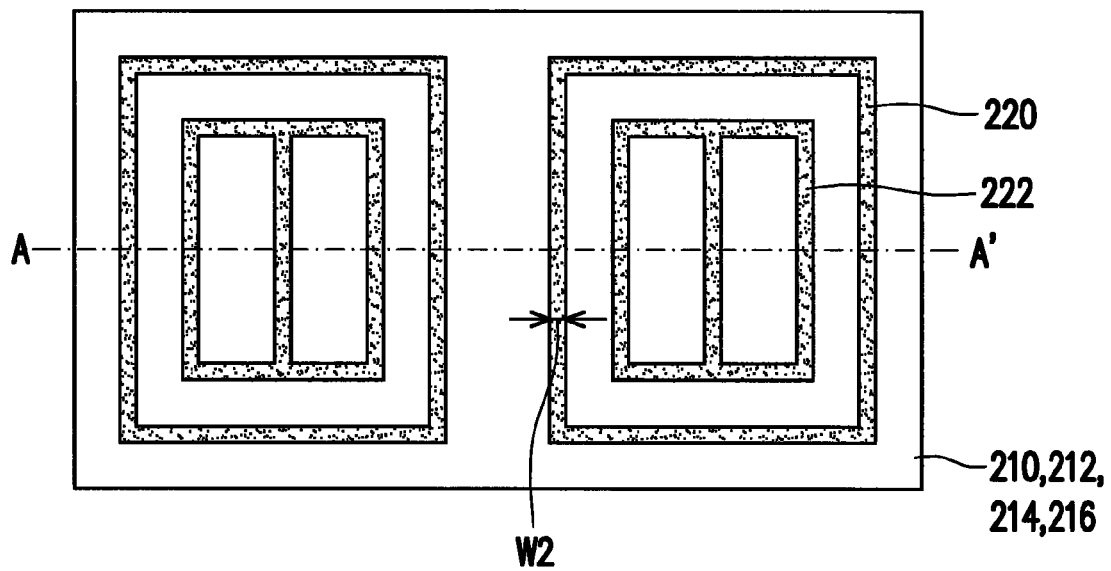
Figure 4B:
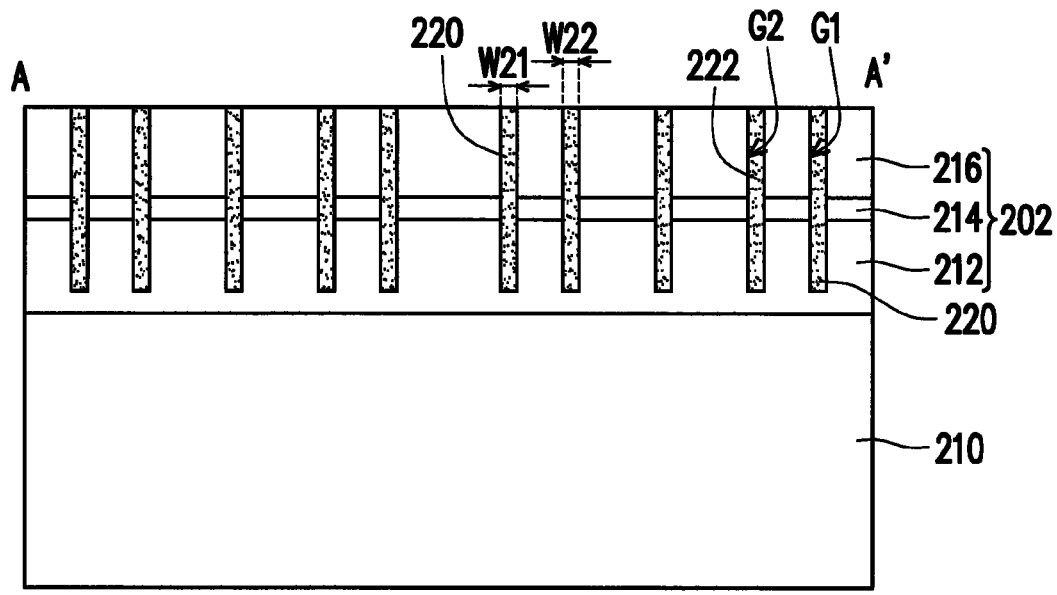

Thereafter, referring to FIG. 4A and FIG. 4B, a high resistant ring wall 220 is formed in the first groove G1, a current block structure 222 is formed in the second groove G2, and the mask layer 218 of FIG. 3B is removed. In this step, a selective area growth method is used for growing a high resistance material in the first groove G1 and the second groove G2 to form the high resistant ring wall 220 and the current block structure 222. Moreover, a buffer oxide etchant (BOE) or hydrofluoric acid (HF) can be used to remove the mask layer 218.

In the present embodiment, the selective area growth method can be the MOCVD method or the MBE method. Since the first groove G1 and the second groove G2 do not penetrate through the first semiconductor layer 212, the exposed first semiconductor layer 212 can serve as a base for material growth in post steps of the selective area growth method. Therefore, materials of the high resistant ring wall 220 and the current block structure 222 are related to a material of the first semiconductor layer 212. In the present embodiment, the first semiconductor layer 212 is a GaN-based material layer, so that the high resistant ring wall 220 and the current block structure 222 can be formed by undoped GaN or undoped GaN series materials.

Certainly, the high resistant ring wall 220 and the current block structure 222 are not limited to be formed according to the selective area growth method, and in other embodiment, the high resistant ring wall 220 and the current block structure 222 can be formed by using other deposition methods (for example, physical vapor deposition (PVD)). When the high resistant ring wall 220 and the current block structure 222 are fabricated by using other deposition methods, materials of the high resistant ring wall 220 and the current block structure 222 are not influenced by the material of the first semiconductor layer 212. For example, in other embodiments, the materials of the high resistant ring wall 220 and the current block structure 222 can be an undoped GaN series material, aluminium oxide, aluminium nitride, a ceramic material, or combinations thereof.

It should be noticed that the high resistant ring wall 220 and the current block structure 222 are formed in the first groove G1 and the second groove G2 according to a growing approach, so that widths W21 and W22 of the high resistant ring wall 220 and the current block structure 222 are not limited by process limitations, but are determined by the sizes of the first groove G1 and the second groove G2. Therefore, the widths W21 and W22 of the high resistant ring wall 220 and the current block structure 222 can be 5 μm to 50 μm.

Figure 5A:
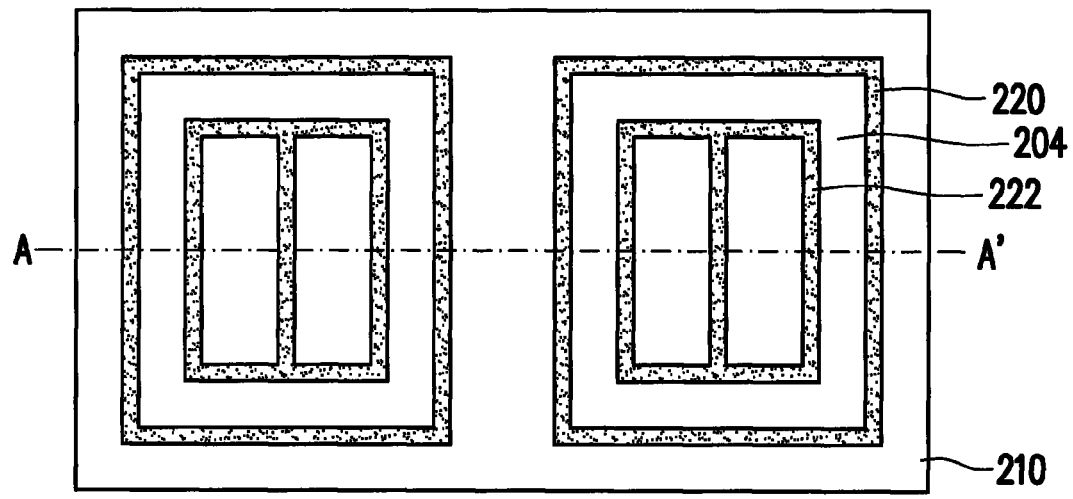
Figure 5B:
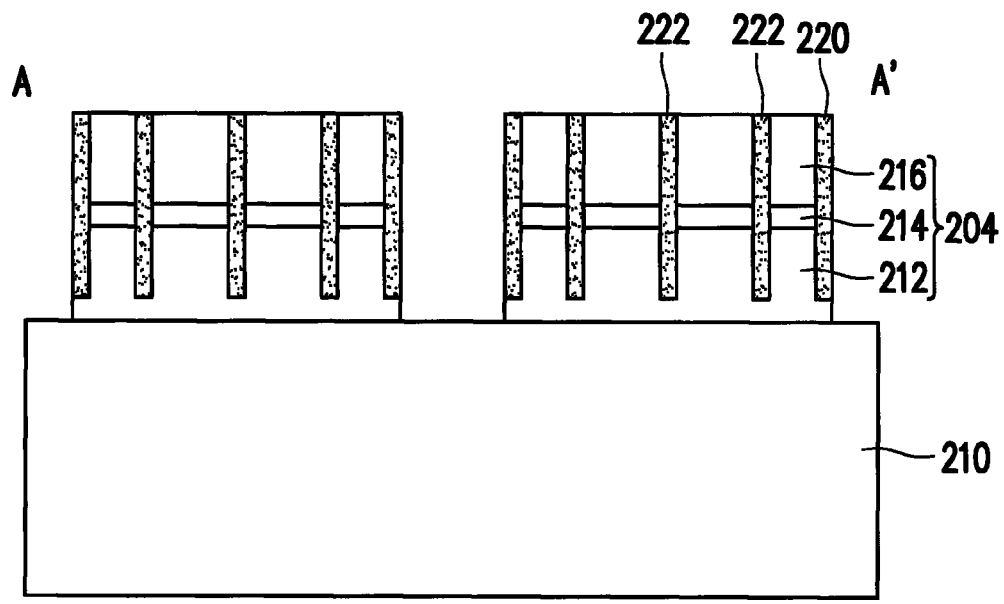

Then, referring to FIG. 5A and FIG. 5B, a part of the epitaxy layer 202 (referring to the epitaxy layer 202 of FIG. 4B) at periphery of the high resistant ring wall 220 is removed to define at least one epitaxy structure 204. In the present embodiment, two epitaxy structures 204 are taken as an example for description, though the number of the epitaxy structures 204 can also be one or more than two. In this step, the part of the epitaxy layer 202 at periphery of the high resistant ring wall 220 can be removed by the chlorine etching method. Moreover, the growth substrate 210 is partially exposed between two adjacent epitaxy structures 204. In the present embodiment, the size of each epitaxy structure 204 is substantially determined by an area surrounded by the high resistant ring wall 220, so that each epitaxy structure 204 is surrounded by one of the high resistant ring walls 220.

Subsequently, referring to FIG. 6A and FIG. 6B, a first electrode 224 and a passivation layer 226 are formed on the second semiconductor layer 216 of the epitaxy structure 204. The first electrode 224 is, for example, formed by an Ohmic contact and mirror reflection material, so that the first electrode 224 can be referred to as an Ohmic contact and mirror reflection layer according to a function thereof, though the disclosure is not limited thereto.

In detail, the first electrode 224 can be formed by sequentially stacking materials of Ni, Ag, Pt, Ti, Au, etc., where thickness of the Ni, Ag, Pt, Ti, and Au materials can be respectively 1 nm, 200 nm, 50 nm, 50 nm, and 100 nm. Therefore, the first electrode 224 may have an Ohmic contact characteristic and a mirror reflection characteristic. A processing temperature of fabricating the first electrode 224 can be 300° C. to 500° C., and in the present embodiment, the first electrode 224 can be fabricated in a nitrogen atmosphere.

Moreover, a material of the passivation layer 226 can be a dielectric material such as silicon oxide, silicon nitride, etc., where a thickness of the passivation layer 226 can be 100 nm to 1000 nm. In the present embodiment, the passivation layer 226 can be formed at periphery of the epitaxy structure 204 through deposition process, so that the thickness of the passivation layer 226 is limited by deposition process limitations. Comparatively, the width of the high resistant ring wall 220 is not limited. Therefore, the high resistant ring wall 220 can perfectly protect the epitaxy structure 204.

According to FIG. 5B, it is known that the height of the high resistant ring wall 220 is equal to the height of the current block structure 222, and an overall height of the epitaxy structure 204 is higher than the height of the high resistant ring wall 220. Therefore, in the present embodiment, the first semiconductor layer 212 of each epitaxy structure 204 has a protrusion portion 212A located at a side of the high resistant ring wall 220 close to the growth substrate 210. Namely, in the epitaxy structure 204 of the present embodiment, a part of the first semiconductor layer 212 is probably exposed at a side surface, so that the passivation layer 226 can be set to protect the exposed side surface of the epitaxy structure 204.

Figure 7A:
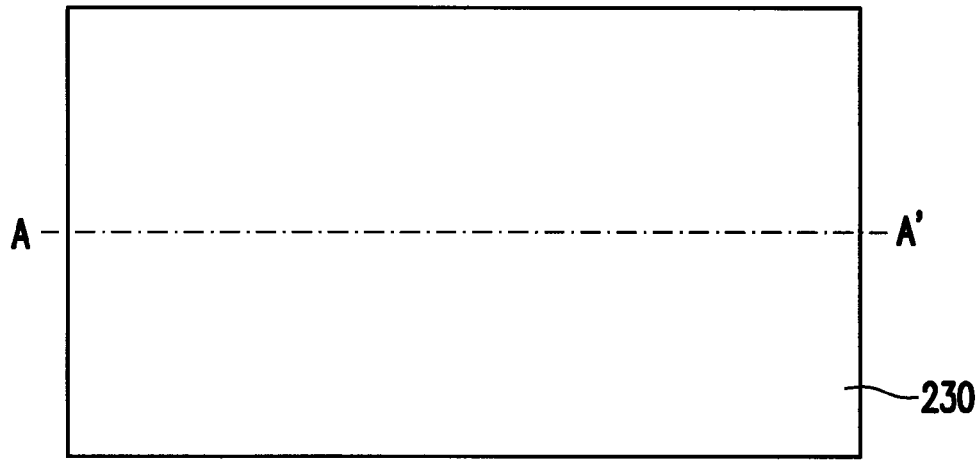
Figure 7B:
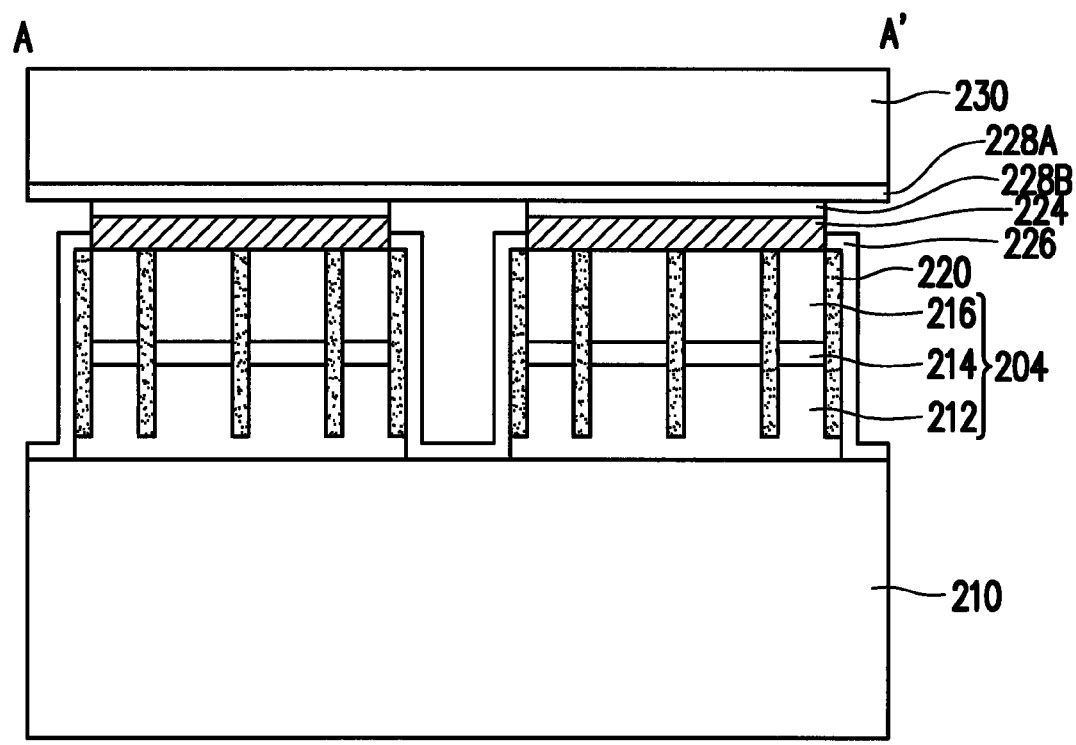

Then, referring to FIG. 7A and FIG. 7B, the epitaxy structure 204 is transferred to a carrier substrate 230. In the present embodiment, the epitaxy structure 204 can be bonded to the carrier substrate 230 through an eutectic bonding method. The eutectic bonding method may include following steps. First, a barrier layer 228A is formed on the carrier substrate 230, where the barrier layer 228A is, for example, formed by stacking materials of Ti, Pt and Au, and thickness of the Ti, Pt and Au materials are respectively 50 nm, 50 nm, and 100 nm. Then, the second electrode 224 is connected to the carrier substrate 230 through an adhesive layer 228B according to the eutectic bonding method. Here, a material of the carrier substrate 230 can be silicon, and a material of the adhesive layer 228B can be an Au/Sn alloy or Au. Moreover, a thickness of the adhesive layer 228B can be 1 μm to 5 μm.

However, the disclosure is not limited thereto, and in other embodiments, the method of bonding the epitaxy structure 204 to the carrier substrate 230 can be an electroplating method. Namely, in the other embodiments, a seed layer (not shown) can be fully formed on a side of the devices shown in FIG. 6B and an electroplating process is performed to plate a substrate material on the side of the devices shown in FIG. 6B to form the carrier substrate wrapping the whole epitaxy structure 204.

Figure 8A:
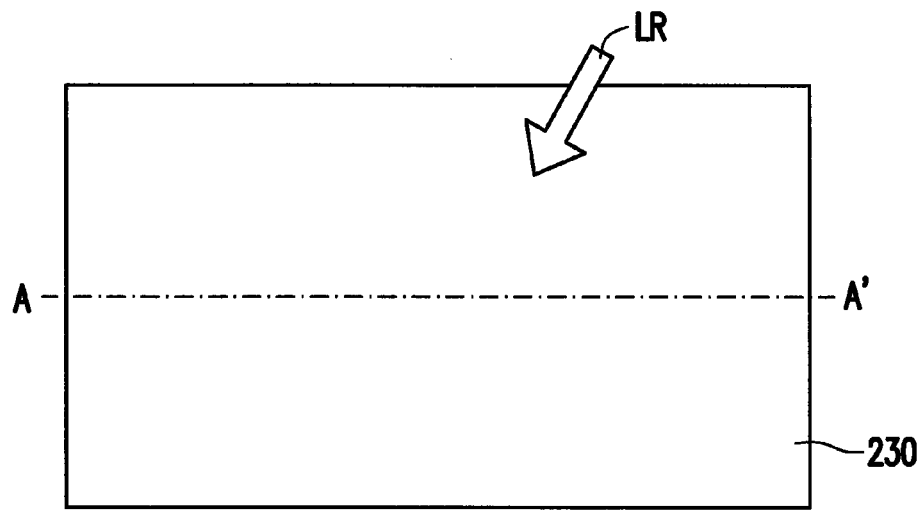
Figure 8B:
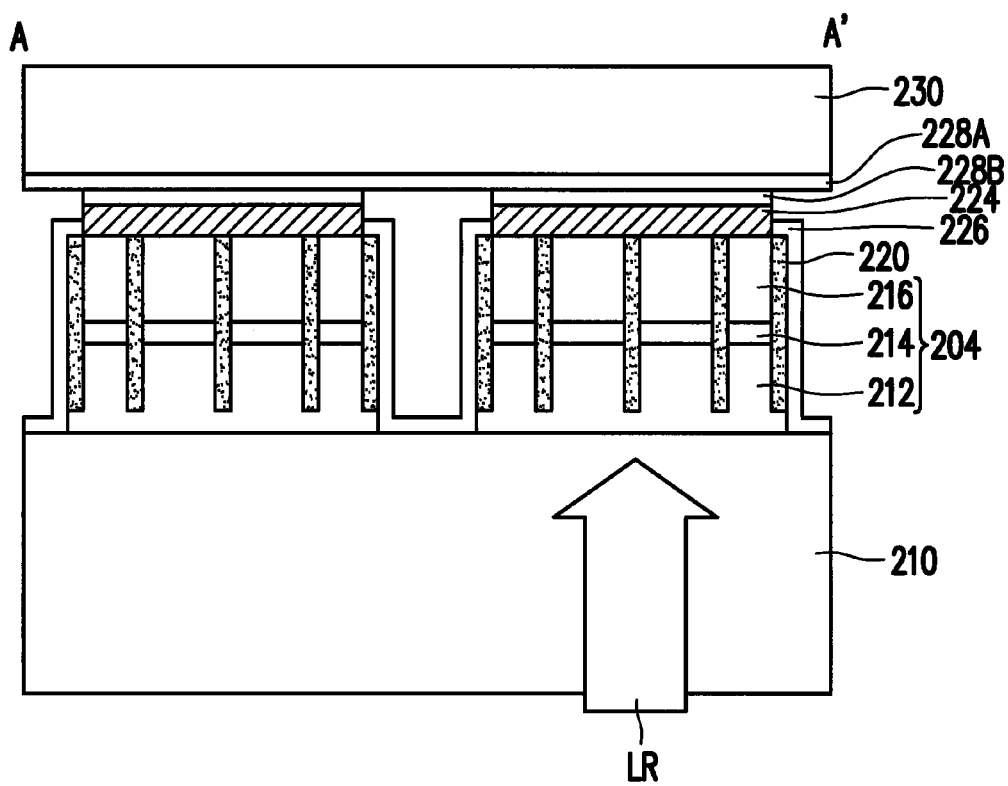

Thereafter, referring to FIG. 8A and FIG. 8B, the growth substrate 210 is removed, and a method of removing the growth substrate 210 is, for example, a laser lift-off (LLO) method. In such step, a laser light LR is used to irradiate an interface between the growth substrate 210 and the epitaxy structure 204 to separate the epitaxy structure 204 and the growth substrate 210.

Figure 6A:
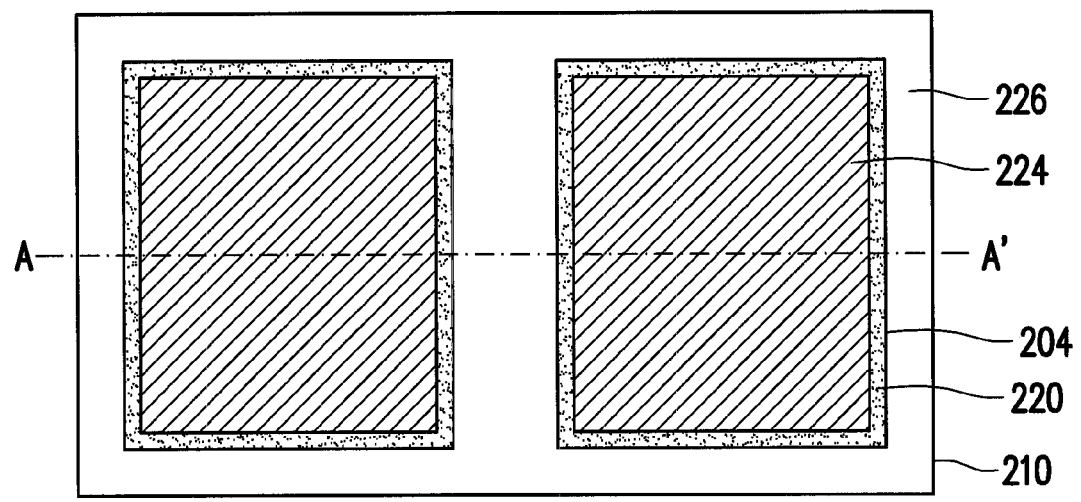
Figure 6B:
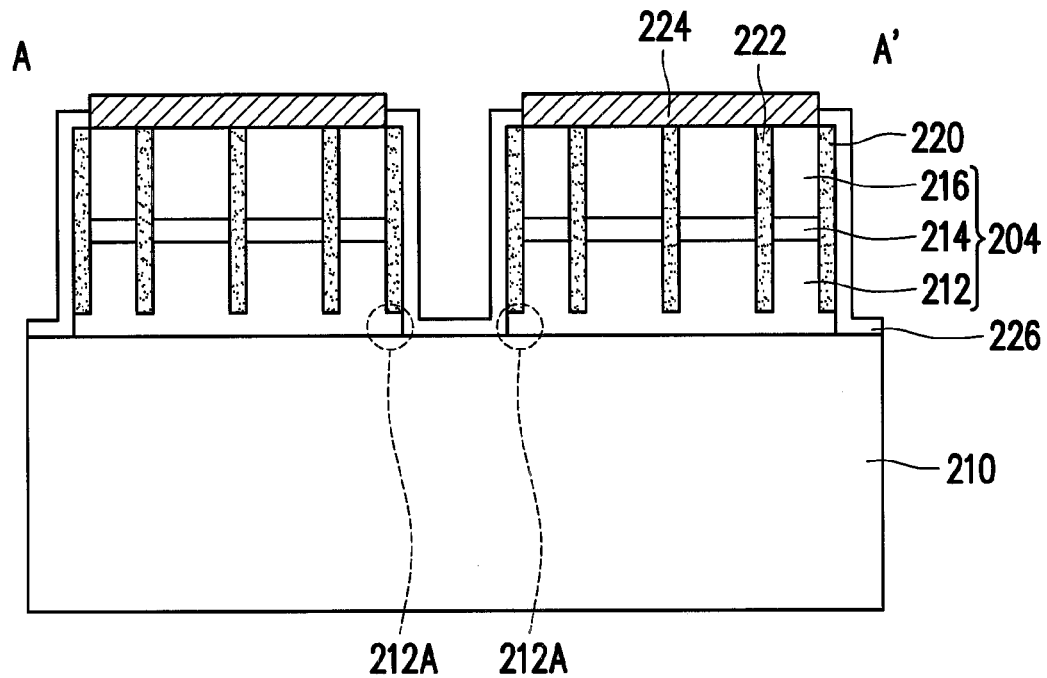

In an embodiment, in the step shown in FIG. 6A and FIG. 6B, a part of the first semiconductor layer 212 between the epitaxy structures 204 is not totally removed to form a thinning area (not shown) between the adjacent epitaxy structures 204. Therefore, the passivation layer 226 formed later covers the thinning area (not shown) instead of contacting the growth substrate 210. Then, when the growth substrate 210 is removed, configuration of the thinning area (not shown) avails reducing damage of the epitaxy structure 204 probably occurred during the process of removing the growth substrate 210. Moreover, the thinning area (not shown) covered with the passivation layer 226 can be further patterned into a plurality of nano pillar structures, which also avails reducing damage of the epitaxy structure 204 probably occurred during the process of removing the growth substrate 210. In other words, in the step shown in FIG. 6A and FIG. 6B, although the epitaxy layer 202 at periphery of the high resistant ring wall 220 is totally removed, the disclosure is not limited thereto.

Figure 9A:
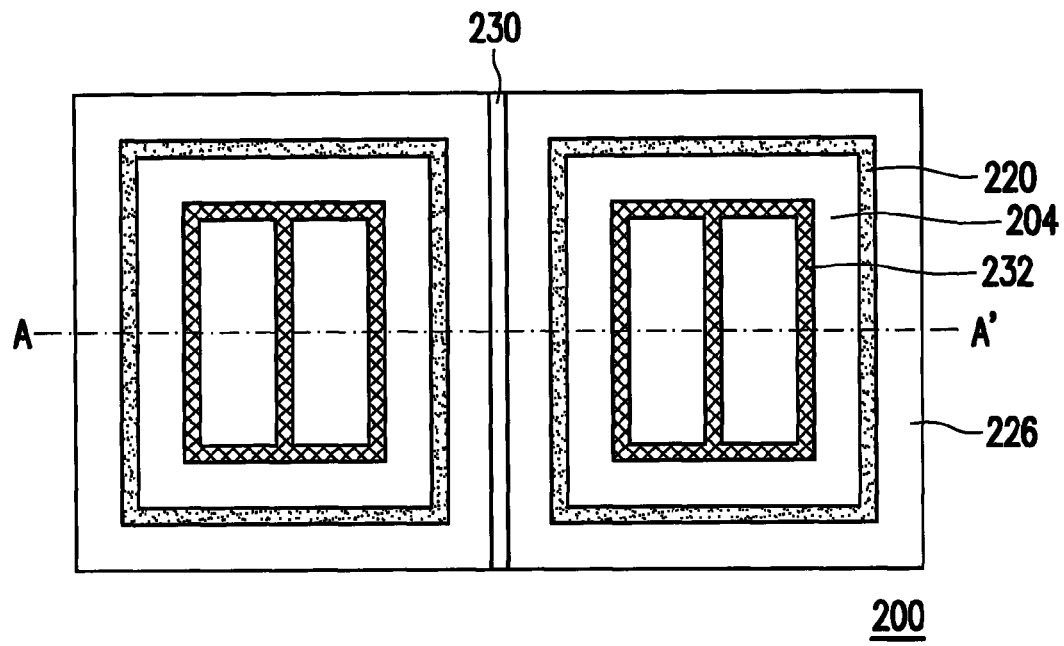
Figure 9B:
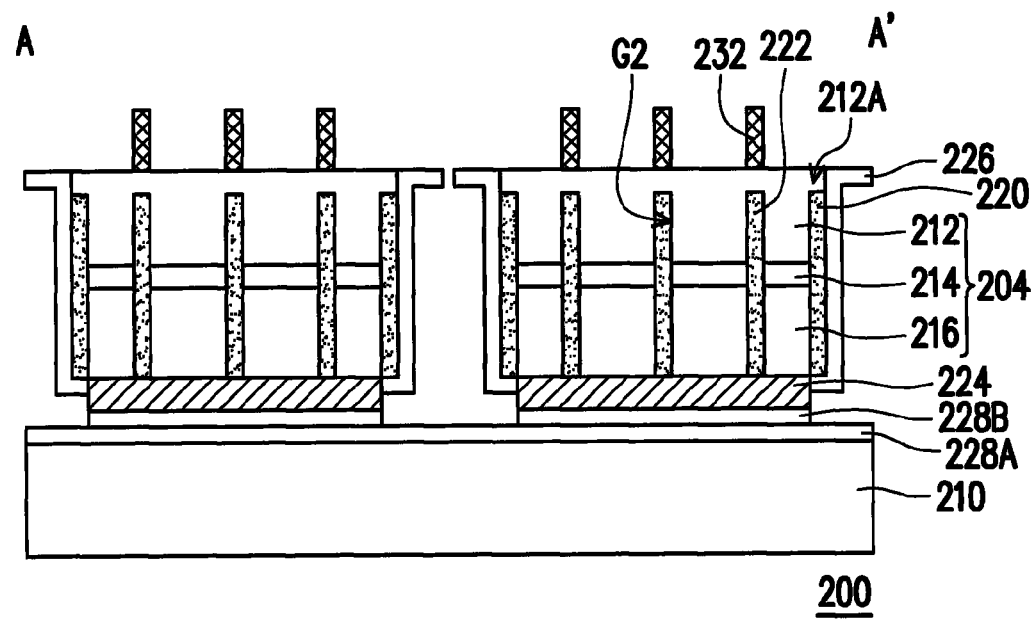

Then, referring to FIG. 9A and FIG. 9B, after the growth substrate 210 shown in FIG. 8A and FIG. 8B is removed, the first semiconductor layer 212 of the epitaxy structure 204 is exposed. Now, by turning over the whole device, the device can be represented by the top view of FIG. 9A and the cross-sectional view of FIG. 9B. Moreover, a second electrode 232 can be further formed on the first semiconductor layer 212 of the epitaxy structure 204 to complete the light emitting device 200. The second electrode 232 is, for example, an N-type electrode, and a configuring position of the second electrode 232 may correspond to the position of the current block structure 222.

In the present embodiment, the side surface of the epitaxy structure 204 is protected by the high resistant ring wall 220, so that during the operation of the light emitting device 200, the epitaxy structure 204 is not liable to have a current leakage phenomenon. Moreover, in the present embodiment, the protrusion portion 212A of the first semiconductor layer 212 of the epitaxy structure 204 is located at a side of the high resistant ring wall 220 away from the carrier substrate 230. A part of the first semiconductor layer 212 is probably exposed at the side surface, so that configuration of the passivation layer 226 can further protect the epitaxy structure 204.

Besides, the second groove G2 formed in the epitaxy structure 204 extends towards the first semiconductor layer 212 from a side of the epitaxy structure 204 contacting the first electrode 224 and does not penetrate through the first semiconductor layer 212. Therefore, stable current can be generated between the second electrode 232 and the first electrode 224 to excite the active layer 214 to produce light. Since the current block structure 222 is formed by a high resistance material, during the operation of the light emitting device 200, no current flows through the position of the current block structure 222. Namely, the part of the epitaxy structure 204 corresponding to the second electrode 232 does not emit light, so as to avoid limiting the light emitting efficiency of the light emitting device 200 due to that the second electrode 232 shields the light. By using the current block structure 222, current in internal of the epitaxy structure 204 is redistributed to achieve ideal light emitting efficiency of the light emitting device 200. In other words, the light emitting device 200 of the embodiment is not liable to have the current leakage phenomenon, and has the ideal light emitting efficiency.

It should be noticed that the current block structure 222 of the present embodiment presents a "θ" shape in the top view figures, so that the second electrode 232 also presents the "θ"

when viewing from a top view. Moreover, when the light emitting device 200 is viewed from the top view, the current block structure 222 and the second electrode 232 are mutually overlapped. Therefore, the light emitting efficiency of the light emitting device 200 can be effectively improved. However, such pattern design is only used as an example, and in other embodiments, the pattern of the current block structure 222 and the second electrode 232 in the top view can be varied along with different design requirements.

Figure 10A:
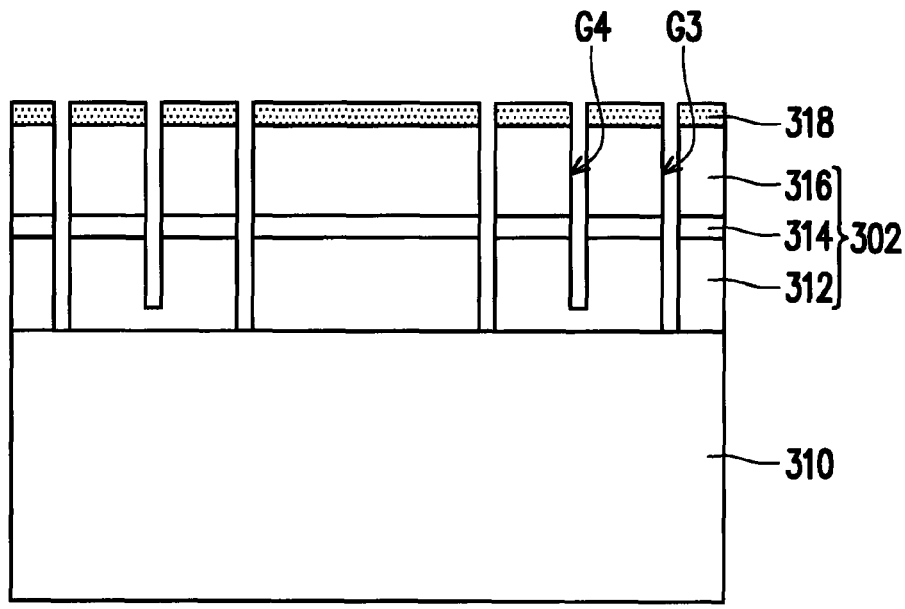
FIG. 10A and FIG. 10F are cross-sectional views of a process of fabricating a light emitting device according to a second embodiment of the disclosure.
Figure 10B:
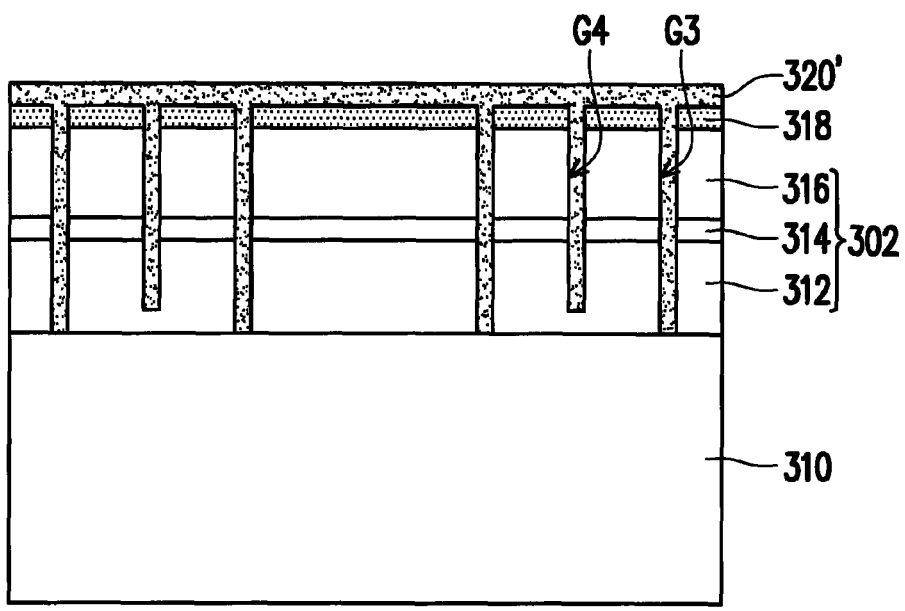
Figure 10C:
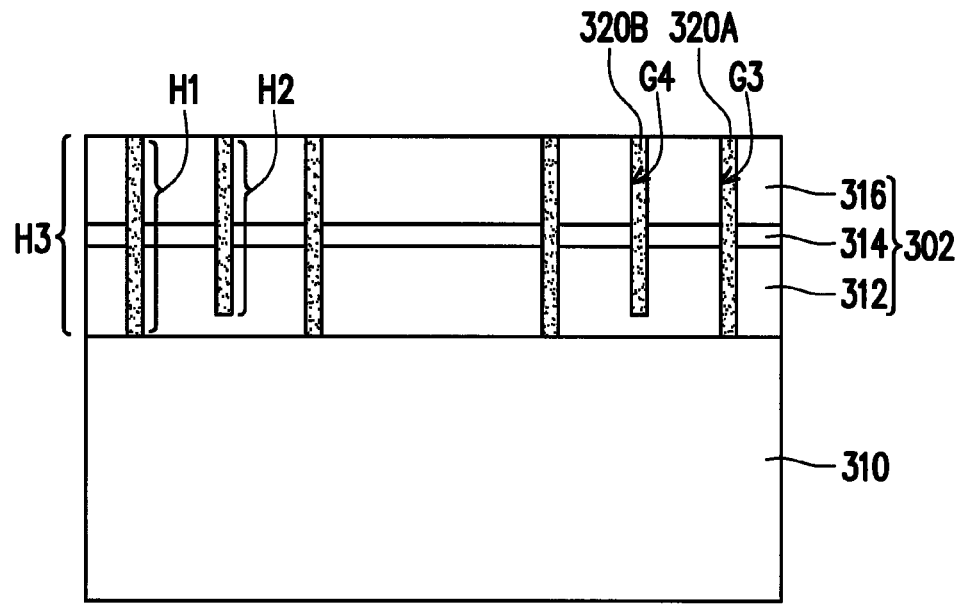
Figure 10D:
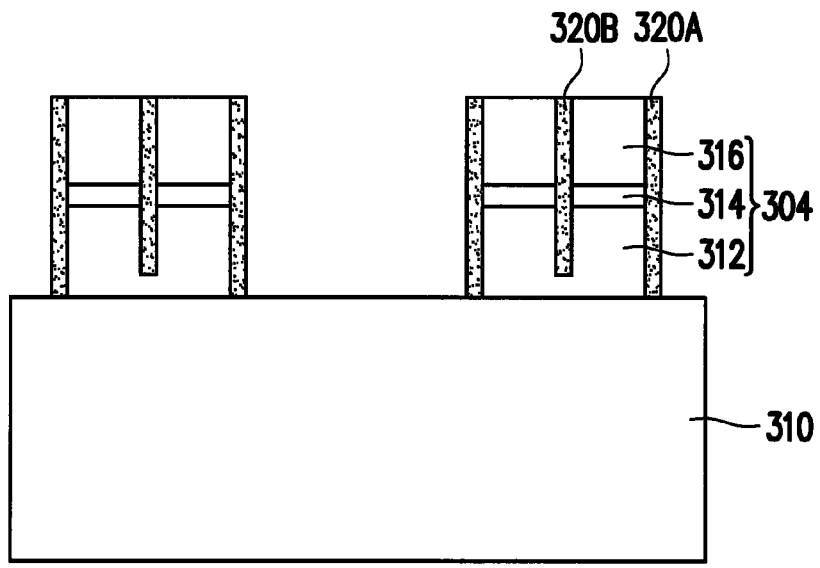
Figure 10E:
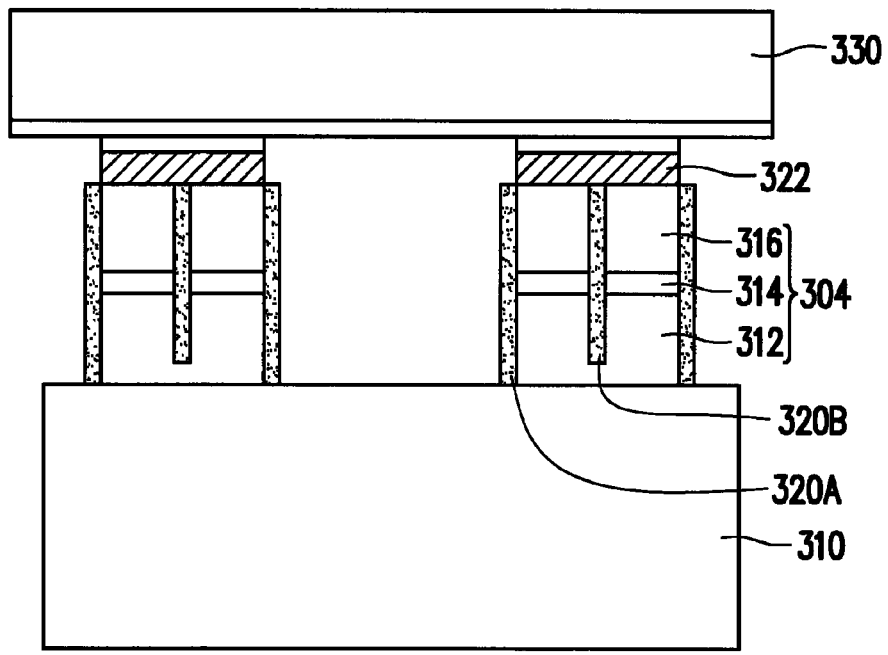
Figure 10F:
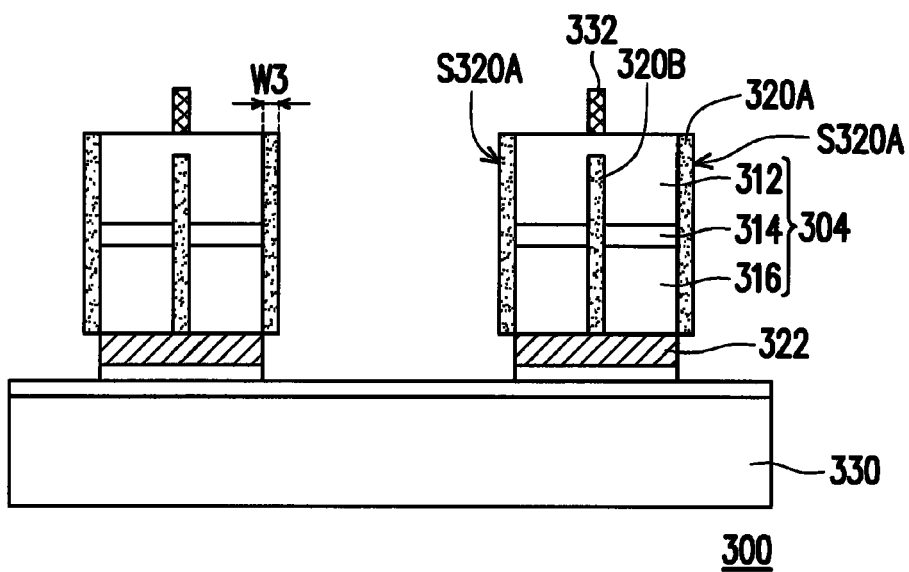

FIG. 10A and FIG. 10F are cross-sectional views of a process of fabricating a light emitting device according to a second embodiment of the disclosure. Referring to FIG. 10A, a first semiconductor layer 312, an active layer 314, and a second semiconductor layer 316 are sequentially grown on a growth substrate 310, where the first semiconductor layer 312, the active layer 314 and the second semiconductor layer 316 together form an epitaxy layer 302. Then, a mask layer 318 is formed on the second semiconductor layer 316 of the epitaxy layer 302, and an etching process is performed while taking the mask layer 318 as a mask to form a plurality of first grooves G3 and a plurality of second grooves G4 in the epitaxy layer 302.

In the present embodiment, related descriptions of the first embodiment can be referred for fabrication conditions of the above steps and materials and sizes of the components. Namely, related descriptions of FIG. 2B and FIG. 3B of the first embodiment can be referred for the steps of FIG. 10A. However, a main difference between the present embodiment and the first embodiment is that the first groove G3 penetrates through the first semiconductor layer 312 of the epitaxy layer 302, and the second groove G4 does not penetrate through the first semiconductor layer 312. Therefore, the growth substrate 310 is partially exposed by the first groove G3.

Then, referring to FIG. 10B, a deposition process is performed to form a high resistance material 320' in the first groove G3 and the second groove G4. Here, the deposition process can be a PVD process such as sputtering, vapor plating, etc., and the high resistance material 320' can be aluminium oxide, aluminium nitride, a ceramic material or combinations thereof. Different to the first embodiment, the required devices are formed without using the selective area growth method, so that the high resistance material 320' can be any material having the high resistance characteristic, and the high resistance material 320' is unnecessary to be related to the material of the first semiconductor layer 312.

Next, referring to FIG. 10C, the mask layer 318 shown in FIG. 10B is removed, and a part of the high resistance material 320' on the mask layer 318 is removed to respectively form a high resistant ring wall 320A and a current block structure 320B in the first groove G3 and the second groove G4. Now, a height H1 of the high resistant ring wall 320A is greater than a height H2 of the current block structure 320B, and the height H1 of the high resistant ring wall 320A is equal to an overall height H3 of the epitaxy layer 302. Therefore, the high resistant ring wall 320A contacts the growth substrate 310, and the first semiconductor layer 312 still exists between the current block structure 320I3 and the growth substrate 310.

Then, referring to FIG. 10D, a part of the epitaxy layer 302 (referring to the epitaxy layer 302 of FIG. 10C) at periphery of the high resistant ring wall 320A is removed to define an epitaxy structure 304. In such step, the part of the epitaxy layer 302 at periphery of the high resistant ring wall 320A can be removed according to the chlorine etching method. Moreover, the growth substrate 310 is partially exposed between two adjacent epitaxy structures 304. It should be noticed that the side surface of the epitaxy structure 304 is totally surrounded by the high resistant ring wall 320A, so that the epitaxy structure 304 can be perfectly protected by the high resistant ring wall 320A without additionally setting a passivation layer.

Then, referring to FIG. 10E, a first electrode 322 is formed on the second semiconductor layer 316 of the epitaxy structure 304, and the epitaxy structure 304 is transferred from the growth substrate 310 to a carrier substrate 330. Here, a method of forming the first electrode 322 is the same to the method of forming the first electrode 224 according to the first embodiment, and a method of transferring the epitaxy structure 304 from the growth substrate 310 to the carrier substrate 330 is also as that describe in the first embodiment. Namely, related descriptions of FIGS. 6B, 7B and 8B of the first embodiment can be referred for the fabrication process of FIG. 10E, which is not repeated herein.

After removing the growth substrate 310, as shown in FIG. 10F, the whole device is turned over and a second electrode 332 is formed on the first semiconductor layer 312 of the epitaxy structure 304 to complete the light emitting device 300, where the second electrode 332 corresponds to the current block structure 320B. In the present embodiment, a method of forming the second electrode 332 is also the same to the method of forming the second electrode 232 in the first embodiment, which is not repeated herein.

It should be noticed that in the present embodiment, the high resistant ring wall 320A totally wraps the side surface of the whole epitaxy structure 304. In this way, the light emitting device 300 does not require an additional passivation layer to wrap the side surface of the epitaxy structure 304. Therefore, an outer surface S320A of the high resistant ring wall 320A is exposed without being wrapped by other components.

A width W3 of the high resistant ring wall 320A can be 5 μm to 50 μm, and such width may indeed protect the epitaxy structure 304. Therefore, configuration of the high resistant ring wall 320A may ensure that the light emitting device 300 is not liable to have the current leakage phenomenon at the side surface of the device during operation, so that the light emitting device 300 may have ideal quality. Further, similar to the first embodiment, the current block structure 320B in the light emitting device 300 can influence a distribution of the current in the epitaxy structure 304 during operation of the light emitting device 300. Therefore, the second electrode 332 does not shield the light emitted from the active layer 314, so that the light emitting device 300 may have ideal light emitting efficiency.

In summary, in the disclosure, a high resistance material is used to form a ring wall on the side surface of the epitaxy structure. In this way, the high resistant ring wall avails avoiding the current leakage phenomenon of the light emitting device. Therefore, the light emitting device has ideal quality. Moreover, the current block structure is formed in internal of the epitaxy structure of the light emitting device, and a configuration position of the second electrode corresponds to the position of the current block structure. Since light is not emitted from the position corresponding to the current block structure, the second electrode does not shield the light emitted from the epitaxy structure. Therefore, the light emitting device of the disclosure may have ideal light emitting efficiency.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A light emitting device, comprising:
    a carrier substrate;
    at least one epitaxy structure, disposed on the carrier substrate, and comprising a first semiconductor layer, an active layer, and a second semiconductor layer stacked in sequence, wherein the first semiconductor layer is relatively away from the carrier substrate and the second semiconductor layer is relatively close to the carrier substrate;
    a high resistant ring wall, surrounding the epitaxy structure, wherein a width of the high resistant ring wall is greater than 5 µm and the high resistant ring wall is in contact with the first semiconductor layer, the active layer and the second semiconductor layer;
    a first electrode, disposed between the carrier substrate and the epitaxy structure; and
    a second electrode, disposed at a side of the epitaxy structure away from the carrier substrate.

2. The light emitting device as claimed in claim 1, wherein the width of the high resistant ring wall is substantially smaller than 50 µm.

3. The light emitting device as claimed in claim 1, further comprising a passivation layer wrapping the high resistant ring wall.

4. The light emitting device as claimed in claim 1, wherein a material of the high resistant ring wall comprises undoped gallium nitride (GaN), an undoped GaN series material, aluminium oxide, aluminium nitride, a ceramic material, or combinations thereof.

5. The light emitting device as claimed in claim 1, wherein the epitaxy structure has at least one groove, and the at least one groove extend towards the first semiconductor layer from a side of the epitaxy structure contacting the first electrode and does not penetrate through the first semiconductor layer.

6. The light emitting device as claimed in claim 5, further comprising at least one current block structure disposed in the at least one groove of the epitaxy structure, wherein the current block structure corresponds to the second electrode such that the current block structure and the second electrode are overlapped when the light emitting device is viewed from a top view.

7. The light emitting device as claimed in claim 6, wherein a height of the high resistant ring wall is substantially equal to a height of the current block structure, and the first semiconductor layer of the epitaxy structure has a protrusion portion located at a side of the high resistant ring wall away from the carrier substrate.

8. The light emitting device as claimed in claim 1, wherein a height of the high resistant ring wall is substantially equal to a height of the epitaxy structure.

9. The light emitting device as claimed in claim 8, wherein an outer surface of the high resistant ring wall is exposed.

* * * * *